(12) United States Patent  
Yang

(10) Patent No.: US 9,184,184 B2
(45) Date of Patent: Nov. 10, 2015

(54) DISPLAY DEVICE AND METHOD FOR MANUFACTURING THE SAME

(71) Applicants: Xiamen Tianma Micro-Electronics Co., Ltd., Xiamen (CN); Tianma Micro-Electronics Co., Ltd., Shenzhen (CN)

(72) Inventor: Yuqing Yang, Xiamen (CN)

(73) Assignees: Xiamen Tianma Micro-Electronics Co., Ltd., Xiamen (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/315,260

(22) Filed: Jun. 25, 2014

(65) Prior Publication Data

US 2015/0187799 A1 Jul. 2, 2015

(30) Foreign Application Priority Data

Dec. 30, 2013 (CN) .......................... 2013 1 0750189

(51) Int. Cl.
*H01L 27/12* (2006.01)
*H01L 29/66* (2006.01)
*H01L 27/15* (2006.01)
*H01L 29/786* (2006.01)
*H01L 23/532* (2006.01)

(52) U.S. Cl.
CPC .......... *H01L 27/124* (2013.01); *H01L 27/1259* (2013.01); *H01L 23/53238* (2013.01); *H01L 27/1225* (2013.01); *H01L 27/153* (2013.01); *H01L 29/66742* (2013.01); *H01L 29/786* (2013.01); *H01L 29/7869* (2013.01)

(58) Field of Classification Search
CPC . H01L 27/124; H01L 27/1259; H01L 27/153; H01L 29/66742; H01L 29/786; H01L 29/7869; H01L 27/1225; H01L 23/53238; H01L 23/53228; G02F 1/136286; G02F 1/136227; G02F 1/134336
USPC ........ 257/72, 59, 79, E21.532; 438/149, 151; 359/199.2, 199.4, 298
See application file for complete search history.

(56) References Cited

U.S. PATENT DOCUMENTS 5,194,974 A * 3/1993 Hamada et al. ............... 349/48
5,781,331 A   7/1998 Carr et al.
7,999,994 B2 * 8/2011 Hagood et al. ............... 359/290
2010/0053727 A1 3/2010 Lee et al.

FOREIGN PATENT DOCUMENTS

WO 2011/053033 A2 5/2011
WO 2012165745 A1 12/2012

* cited by examiner

*Primary Examiner* — Thinh T Nguyen
(74) *Attorney, Agent, or Firm* — Alston & Bird LLP

(57) ABSTRACT

Disclosed are a display device and a method for manufacturing the same. The display device includes a Thin Film Transistor (TFT) substrate and a color filter substrate opposite to each other. The TFT substrate includes a first TFT element and a second TFT element and a light-transmittance region between the first and second TFT elements is a pixel region; and a pixel unit arranged on a surface of the TFT substrate facing the color filter substrate and located on a surface of the pixel region, where the pixel unit includes a transparent reference potential layer arranged on the surface of the TFT substrate facing the color filter substrate and a nontransparent deformation layer arranged over the reference potential layer, with the deformation layer being insulated from the reference potential layer.

20 Claims, 4 Drawing Sheets

DISPLAY DEVICE AND METHOD FOR MANUFACTURING THE SAME

CROSS-REFERENCES TO RELATED APPLICATIONS

This application claims the benefit of priority to Chinese Patent Application No. 201310750189.1, filed with the Chinese Patent Office on Dec. 30, 2013 and entitled "DISPLAY DEVICE AND METHOD FOR MANUFACTURING THE SAME", the content of which is incorporated herein by reference in its entirety.

FIELD OF THE INVENTION

The present disclosure relates to the technical field of displays, and in particular to a display device and a method for manufacturing the same.

BACKGROUND OF THE INVENTION

A Liquid Crystal Display (LCD) has become a mainstream display device due to its features such as low power consumption and simple processes of large screen display.

Generally, a conventional LCD includes a Thin Film Transistor (TFT) substrate and a color filter substrate which are arranged opposite to each other, and a liquid crystal layer arranged between the TFT substrate and the color filter substrate. In order to make liquid crystal molecules of the liquid crystal layer capable of controlling emitted light, it is necessary to form a common electrode on the inner surface of the color filter substrate and an upper polarizer on the outer surface of the color filter substrate, and form an oriented film on the inner surface of the TFT substrate and a lower polarizer on the outer surface of the TFT substrate. It can be seen that, the structure of the LCD is complex, which leads to a high manufacturing cost.

BRIEF SUMMARY OF THE INVENTION

In order to solve the above technical problem, the present disclosure provides a display device, which has a simple structure and a low manufacturing cost.

To achieve the above object, the present disclosure provides technical solutions as follows.

A display device is provided, which includes: a Thin Film Transistor (TFT) substrate and a color filter substrate arranged opposite to each other, where the TFT substrate includes a first TFT element and a second TFT element, and a light-transmission region between the first TFT element and the second TFT element is a pixel region; a pixel unit, arranged on a surface of the TFT substrate facing the color filter substrate and located on a surface of the pixel region, where the pixel unit includes a transparent reference potential layer arranged on the surface of the TFT substrate facing the color filter substrate and a nontransparent deformation layer arranged over the transparent reference potential layer, and the nontransparent deformation layer is insulated from the transparent reference potential layer; where an output electrode of the first TFT element is electrically connected to the transparent reference potential layer, an output electrode of the second TFT element is electrically connected to the nontransparent deformation layer, and the deformation layer deforms elastically or flexibly to an extent (a deformation state) corresponding to a voltage difference between the nontransparent deformation layer and the transparent reference potential layer with a fixed connection part between the nontransparent deformation layer and the TFT substrate acting as a fixed axis based on the voltage difference, to change a coverage area of the deformation layer over the pixel region.

The present disclosure further provides a method for manufacturing a display device. The method includes: providing a Thin Film Transistor (TFT) substrate including a first TFT element and a second TFT element; forming, on an insulation layer of an upper surface of the TFT substrate, a first groove extending to an output electrode of the first TFT element and a second groove extending to an output electrode of the second TFT element; forming a reference potential layer on the upper surface of the TFT substrate, with the reference potential layer being electrically connected to the output electrode of the first TFT element through the first groove; forming a deformation layer on the reference potential layer, with the deformation layer being electrically connected to the output electrode of the second TFT element through the second groove, where the deformation layer is insulated from the reference potential layer; and providing a color filter substrate and adhering the color filter substrate to the TFT substrate, with the deformation layer and the reference potential layer being located between the color filter substrate and the TFT substrate; where the deformation layer is capable of being elastically (flexibly) deformed to different extents (deformation states) with a fixed connection part between the deformation layer and the TFT substrate acting as a fixed axis to change a coverage area of the deformation over a pixel region between the first TFT element and the second TFT element.

From the above, the present disclosure provides a display device and a method for manufacturing the display device. The pixel unit of the flat panel display device includes a transparent reference potential layer fixedly arranged on the surface of the TFT substrate facing the color filter substrate and a nontransparent deformation layer arranged between the reference potential layer and the color filter substrate, with the deformation layer being insulated from the reference potential layer. The deformation layer may deform elastically (flexibly) to an extent (deformation state) corresponding to the voltage difference with the fixed connection part between the deformation layer and the TFT substrate acting as a fixed axis. Therefore, the voltage of the reference potential layer may be controlled by the first TFT element and the voltage of the deformation layer may be controlled by the second TFT element, thus the voltage difference between the deformation layer and the reference potential layer may be controlled, the coverage area of the deformation layer over the pixel region may be controlled, and the light transmittance of the pixel region may be controlled.

It can be seen that the light transmittance of the pixel region may be controlled by the reference potential layer and the deformation layer without employing liquid crystal material in the display device. Therefore, compared with the conventional LCD, the display device according to the disclosure has a simple structure since there is no common electrode and upper polarizer on the color filter substrate and there is no oriented film and lower polarizer on the TFT substrate, the manufacture process is simple and the cost is low.

BRIEF DESCRIPTION OF THE DRAWINGS

The accompanying drawings used in the description of the embodiments or the prior art will be described briefly as follows, so that the technical solutions according to the embodiments of the present invention or according to the prior art will become clearer. It is obvious that the accompanying drawings in the following description are only some embodiments of the present invention. For those skilled in the art, other accompany drawings may be obtained according to these accompanying drawings without any creative work.

FIG. 1b is a schematic structural diagram of a pixel unit of the display device shown in FIG. 1a;

DETAILED DESCRIPTION OF THE INVENTION

Figure 1A:
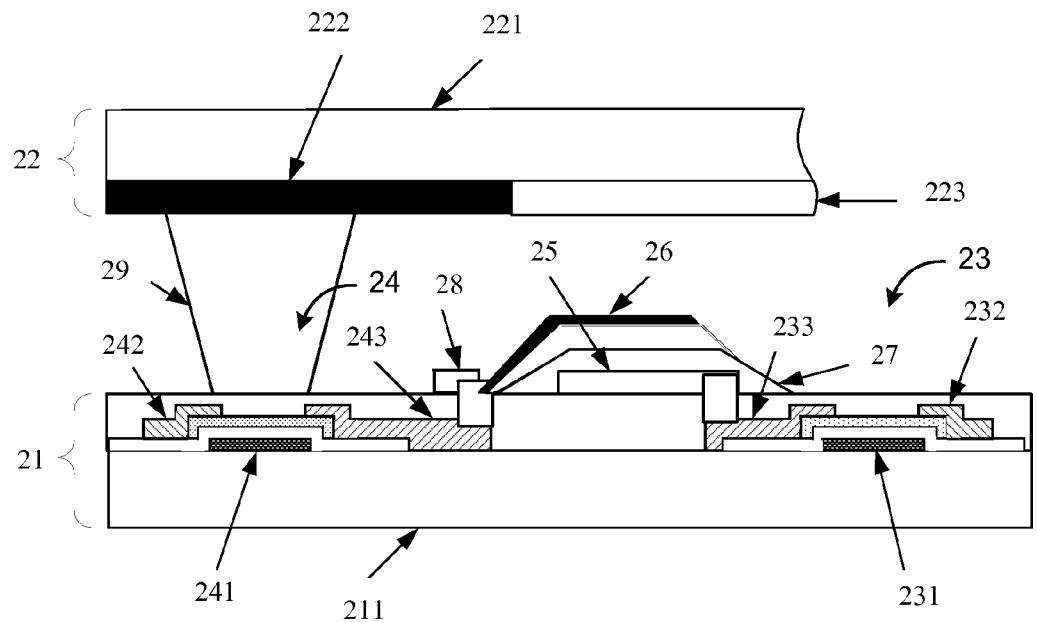
FIG. 1a is a schematic structural diagram of a display device according to an embodiment of the present disclosure.

As described in the background, the conventional LCD controls emitted light by driving rotation of liquid crystal molecules of a liquid crystal layer. It is necessary to form a power supply common electrode on the inner surface of the color filter substrate and an upper polarizer on the outer surface of the color filter substrate, and form an oriented film on the inner surface of the TFT substrate and a lower polarizer on the outer surface of the TFT substrate. Therefore, the structure of the LCD is complex, which leads to a high cost.

The inventor found that, by arranging a reference potential layer and a nontransparent deformation layer in a pixel region of a TFT substrate and controlling the voltages of the deformation layer and the reference potential layer by TFT elements of the TFT substrate, the deformation layer may be controlled to be deformed to different extents (deformation states), that is, the light transmittance of the pixel region may be controlled by the deformation layer, thus image display may be controlled without a liquid crystal material.

Based on the above findings, the present disclosure provides a display device, including:

a Thin Film Transistor (TFT) substrate and a color filter substrate arranged opposite to each other, where the TFT substrate includes a first TFT element and a second TFT element, and a light-transmission region between the first TFT element and the second TFT element is a pixel region; and a pixel unit arranged on a surface of the TFT substrate facing the color filter substrate and located on a surface of the pixel region, where the pixel unit includes a transparent reference potential layer arranged on the surface of the TFT substrate facing the color filter substrate and a nontransparent deformation layer arranged over the reference potential layer, and the deformation layer is insulated from the reference potential layer;

where an output electrode of the first TFT element is electrically connected to the reference potential layer, an output electrode of the second TFT element is electrically connected to the deformation layer, the deformation layer deforms elastically (flexibly) to an extent (deformation state) corresponding to a voltage difference between the deformation layer and the reference potential layer with a fixed connection part between the deformation layer and the TFT substrate acting as a fixed axis based on the voltage difference, to change coverage area of the deformation layer over the pixel region.

For the display device of the present disclosure, the voltage of the reference potential layer may be controlled by the first TFT element and the voltage of the deformation layer may be controlled by the second TFT element, thus the voltage difference between the deformation layer and the reference potential layer may be controlled, and the coverage area of the deformation layer over the pixel region may be controlled, thereby light transmittance of the pixel region may be controlled.

It can be seen that, light transmittance of the pixel region may be controlled by the reference potential layer and the deformation layer without employing a liquid crystal material in the flat panel display device. Therefore, compared with the conventional LCD, the display device according to the disclosure has a simple structure since there is no common electrode and upper polarizer on the color filter substrate and no oriented film and lower polarizer on the TFT substrate, the manufacturing process is simple and the cost is low.

The above is the core concept of the present application. The technical solution according to the embodiments of the present invention will be described clearly and completely below in conjunction with the accompanying drawings. It is obvious that the described embodiments are only part of the embodiments according to the present invention. All the other embodiments obtained by those skilled in the art based on the embodiments in the present invention without any creative work belong to the protection scope of the present invention.

More specific details will be set forth in the following descriptions, however, the invention can also be implemented by other ways different from the way described herein, similar extensions can be made by those skilled in the art without departing from the spirit of the invention, therefore the invention is not limited to particular embodiments disclosed hereinafter.

In addition, the present invention is described in conjunction with the schematic drawings. In describing the embodiments of the present invention in detail, for ease of illustration, schematic views showing the structure of the device are enlarged partially without usual scale, and the views are only examples, which should not be understood as limiting the protection scope of the invention. Furthermore, in an actual manufacture process, three-dimensioned space sizes, i.e., length, width and depth should be considered.

Based on the above concept, an embodiment of the present disclosure provides a display device. Referring to FIG. 1a, the display device includes: a Thin Film Transistor (TFT) substrate 21 and a color filter substrate 22 which are arranged opposite to each other, and a pixel unit arranged on a surface of the TFT substrate 21 facing the color filter substrate 22.

The color filter substrate 22 includes a first substrate 221, a black matrix 222 arranged on a surface of the first substrate facing the TFT substrate 21, and a color filter 223. A region corresponding to the black matrix 222 is a non-display region which is non-transparent. Preferably, the display device further includes a transparent conducting layer (not shown in FIG. 1a) arranged on a surface of the color filter substrate facing away from the TFT substrate, for electrostatic protection. The transparent conducting layer may be an ITO layer.

The TFT substrate includes a second substrate 211, and a first TFT element 23 and a second TFT element 24 which are arranged on a surface of the second substrate 211 facing the color filter substrate 22. The first TFT element includes a control electrode 231, an input electrode 232 and an output electrode 233. The second TFT element 24 includes a control electrode 241, an input electrode 242 and an output electrode 243.

A light-transmission region between the first TFT element 23 and the second TFT element 24 is a pixel region. The control electrode is a gate electrode of the TFT element, the input electrode is a source electrode of the TFT element and the output electrode is a drain electrode of the TFT element.

Figure 1B:
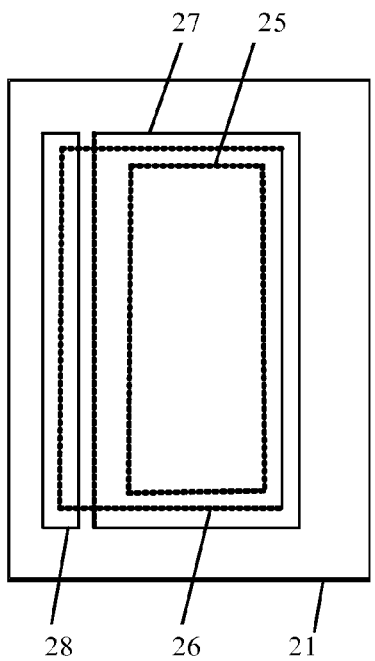

Referring to FIGS. 1a and 1b, the pixel unit includes a transparent reference potential layer 25 and a nontransparent deformation layer 26. The pixel unit is arranged on a surface of the pixel region. The reference potential layer 25 is arranged on a surface of the TFT substrate 21 facing the color filter substrate 22, and the deformation layer 26 is arranged over the reference potential layer 25 and is insulated from the reference potential layer 25. The reference potential layer 25 is covered by a transparent insulation layer 27.

The output electrode 233 of the first TFT element 23 is electrically connected to the reference potential layer 25, and the voltage of the reference potential layer 25 is controlled by the output electrode 233. The output electrode 243 of the second TFT element 24 is electrically connected to the deformation layer 26, and the voltage of the deformation layer 26 is controlled by the output electrode 243.

The deformation layer 26 is a conducting layer which may deform elastically (flexibly). In the case where the voltages of the deformation layer 26 and the reference potential layer 25 are different, electric field intensities of the deformation layer 26 and the reference potential layer 25 are different, which leads to different electric field forces applied to the deformation layer 26. Therefore, the deformation layer 26 may deform elastically (flexibly) to an extent (deformation state) corresponding to a voltage difference between the deformation layer 26 and the reference potential layer 25 with a fixed connection part between the deformation layer 26 and the TFT substrate 21 acting as a fixed axis based on the voltage difference, to change coverage area of the deformation layer over the pixel region.

In order to prevent the deformation layer 26 from falling off and to make the deformation layer 26 be connected to the TFT substrate 21 more steady, a protection layer 28 is arranged on the surface of the fixed connection part. The material of the protection layer 28 is a material of high adhesion, such as silicon dioxide.

The TFT substrate 21 and the color filter substrate 22 are connected fixedly by a support component 29. The thickness of the support component 29 is greater than the distance between a highest point of the deformation layer 26 and the upper surface of the TFT substrate when the deformation layer 26 has a maximum deformation, so that there is a space high enough for the elastic deformation of the deformation layer 26. The support component 29 may have a cylinder shape, a cube shape, a sphere shape, a corpus vertebrae shape, or a frustum shape.

In order to reduce air resistance, the pixel unit is a hermetic space in which the pressure is less than the standard atmospheric pressure, to reduce resistance of the gas pressure to the motion of the deformation layer 26. The hermetic space is filled with only a gas for inhibiting oxidation, to prevent the deformation layer 26 from aging due to oxidation and ensure a longer use life of the deformation layer 26. Specifically, the gas for inhibiting oxidation may be a nitrogen gas, any one of inert gases, a mixture of multiple inert gases, or a mixture of the nitrogen gas and one or more inert gases.

In the embodiment, the material of the deformation layer 26 may be titanium, copper, silver or aluminum, but not limited to the these materials. The thickness of the deformation layer 26 is in a range of 1 nm to 10000 nm, inclusive. The thickness may be set depending on a set deformation extent (state).

Figure 2:
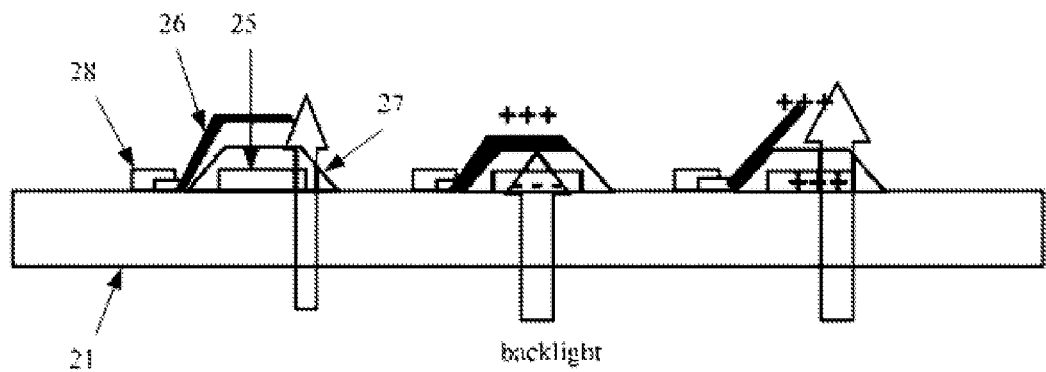
FIG. 2 is a schematic diagram of a principle for controlling a display device according to an embodiment of the present disclosure.

Referring to FIG. 2, which illustrates different light-transmission states of three pixel units on one TFT substrate 21. Voltages are applied to the reference potential layer 25 and the deformation layer 26 of the left pixel unit, and the deformation layer 26 keeps in an initial state and a portion of light passes through. Voltages with opposite polarities are applied to the reference potential layer 25 and the deformation layer 26 of the center pixel unit, so that the deformation layer 26 covers the surface of the insulation layer 27 completely, and the light cannot pass through. Voltages with the same polarities are applied to the reference potential layer 25 and the deformation layer 26 of the right pixel unit, so that the deformation layer 26 deforms elastically (flexibly) in an upturning manner, the backlight can pass through, and the light transmittance is controlled by controlling the extent (state) of the upturning.

It can be seen from the above description that for the display device in the embodiment, by controlling the voltage difference between the deformation layer and the reference potential layer and the polarities of the voltages of the deformation layer and the reference potential layer, the deformation extent (state) of the deformation layer may be controlled, the coverage area of the deformation layer over the pixel region may be controlled, and thus the light transmittance may be controlled, to achieve image display with different gray scales.

It can be seen that, light transmittance of the pixel region may be controlled by the reference potential layer and the deformation layer without employing liquid crystal material in the flat panel display device. Therefore, compared with the conventional LCD, the display device according to the disclosure has a simple structure since there is no common electrode and upper polarizer on the color filter substrate and no oriented film and lower polarizer on the TFT substrate, the manufacture process is simple and the cost is low.

Figure 3:
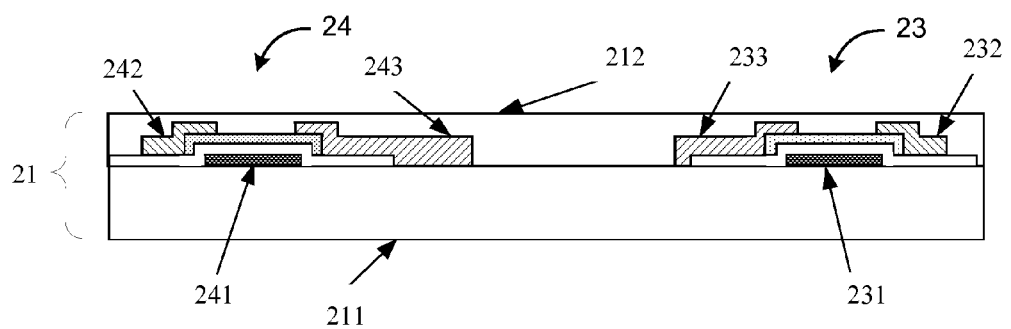
FIGS. 3 to 6 are schematic diagrams showing a flow of a method for manufacturing a display device according to an embodiment of the present disclosure.

An embodiment of the present application provides a method for manufacturing the above described display device. The method includes the following stages in sequence:

At S11: providing a TFT substrate 21, referring to FIG. 3.

The TFT substrate 21 includes a second substrate 211 and a first TFT element 23 and a second TFT element 24 which are arranged on the second substrate 211. The first TFT element includes a control electrode 231, an input electrode 232 and an output electrode 233. The second TFT element 24 includes a control electrode 241, an input electrode 242 and an output electrode 243. In addition, the TFT substrate 21 further includes a passivation layer 212 covering the first TFT element 23 and the second TFT element 24.

Figure 4:
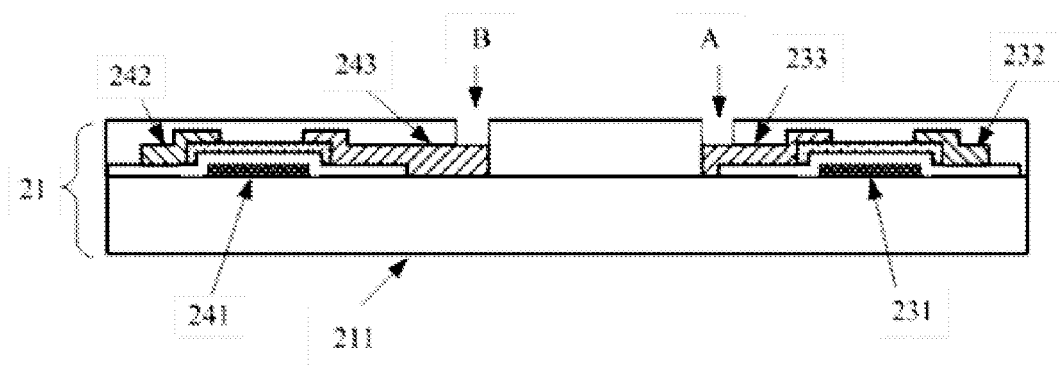

At S12: forming a first groove A and a second groove B in the TFT substrate 21, referring to FIG. 4.

The first groove A and the second groove B may be formed by a process such as photolithography and laser etching. The first groove A extends to the output electrode 233 of the first TFT element 23 and the second groove B extends to the output electrode 243 of the second TFT element 24.

Figure 5:
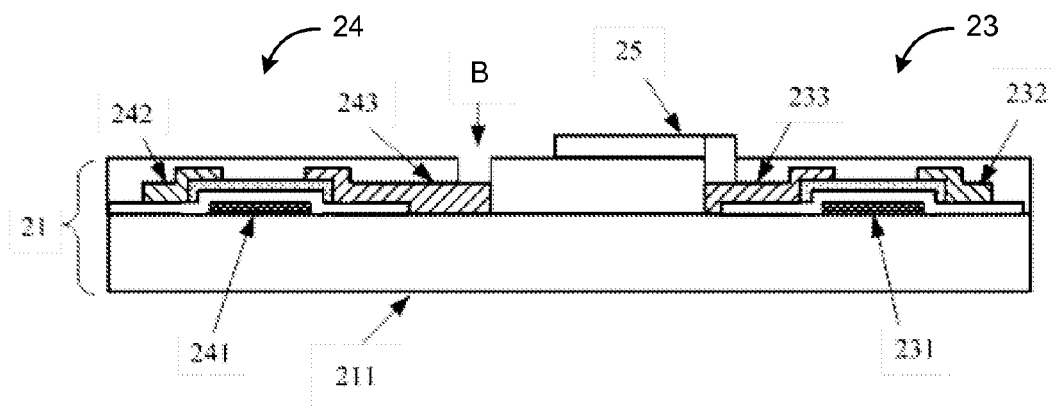

At S13: forming a reference potential layer 25 on the upper surface of the TFT substrate 21, with the reference potential layer 25 being electrically connected to the output electrode 233 of the first TFT element 23 through the first groove A, referring to FIG. 5.

Firstly, a whole transparent conducting layer may be formed on the upper surface of the TFT substrate 21, where the material of the transparent conducting layer deposits in the first groove A to be electrically connected to the output electrode 233. Then the transparent conducting layer is etched by photolithography to form the reference potential layer 25 with a preset shape.

Figure 6:
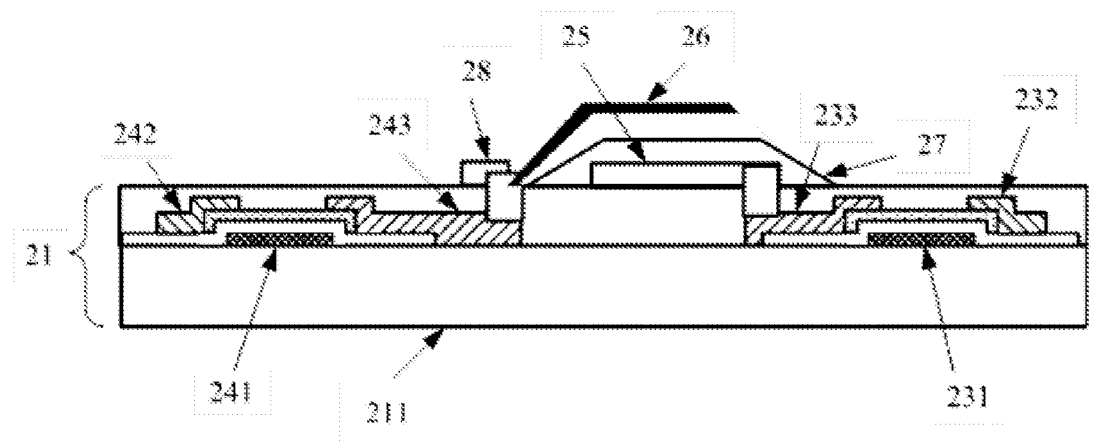
Figure 7:
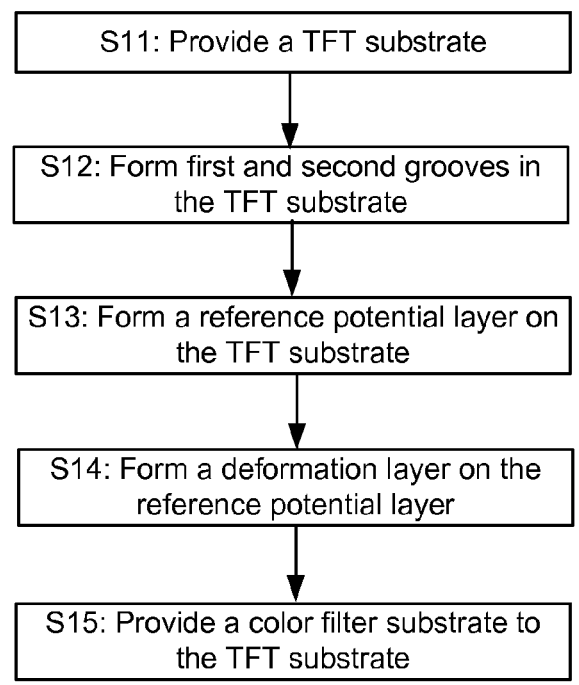
FIG. 7 is a flow chart of various stages in sequence of a method for manufacturing a display device according to an embodiment of the present disclosure.

At S14: forming a deformation layer 26 on the reference potential layer 25, with the deformation layer 26 being electrically connected to the output electrode 243 of the second TFT element 24 through the second groove B and being insulated from the reference potential layer 25, referring to FIG. 6.

In the above process, an insulation layer 27 with a preset shape is firstly formed on the surface of the reference potential layer 25 to ensure the deformation layer 26 to be insulated from the reference potential layer 25. A photoresist layer is covered on the insulation layer 27, and the deformation layer 26 is formed on the photoresist layer after the photoresist is cured. The deformation layer 26 with a preset shape is formed by a film-coating process and an etching process. In the film-coating process, the second groove B may be filled with the material of the deformation layer 26, so that the deformation layer 26 is electrically connected to the output electrode 243 of the second TFT element 24. Finally, the photoresist is removed to make the deformation layer 26 be fixed by only a part that is connected to the second groove B, and thus other part of the deformation layer 26 may be deformed elastically or flexibly.

In order to make the deformation layer 26 be connected to the TFT substrate more steady, a protection layer 28 is formed on the fixed connection part, which is disposed between the deformation layer 26 and the TFT substrate. The protection layer 28 may be a silicon dioxide layer which may be formed by a deposition and film-coating process and an etching process.

At S15: providing a color filter substrate 22 and adhering the color filter substrate 22 to the TFT substrate 21, with the deformation layer 26 and the reference potential layer 25 being located between the color filter substrate 22 and the TFT substrate 21. The structure of the display device formed finally is shown as FIG. 1.

The deformation layer 26 may be elastically (flexibly) deformed to different extents (deformation states) with the fixed connection part between the deformation layer 26 and the TFT substrate 21 acting as a fixed axis, to change the coverage area of the deformation layer over the pixel region between the first TFT element and the second TFT element.

In order to prevent light leak on edges, the fixed connection part between deformation layer 26 and the TFT substrate is covered by a projection of a black matrix 222 of the color filter substrate 22 on the TFT substrate, that is, the area of the projection of the deformation layer 26 on the TFT substrate is larger than an opening of the black matrix 222.

A transparent conducting layer may be formed on the surface of the color filter substrate facing away from TFT substrate before the color filter substrate is adhered to the TFT substrate, to avoid static interference on the display device.

The color filter substrate 22 and the TFT substrate 21 are arranged hermetically with a low pressure to reduce the resistance to the deformation layer 26. In addition, the hermetic space is filled with only a gas for inhibiting oxidation, to prevent the deformation layer 26 from aging due to oxidation and ensure a longer useful life of the deformation layer 26.

It can be seen from the above description that, the display device manufactured by the manufacturing method of the present embodiment does not have a liquid crystal layer. During the manufacture, there is no flattening process to the liquid crystal layer, and there is no common electrode and upper polarizer on the color filter substrate and no oriented film and lower polarizer on the TFT substrate. The manufacture process is simple and the cost is low.

It should be noted that, there are different emphasizes in the apparatus embodiments and the method embodiments, and the same or similar descriptions may be referred to each other. The relationship terminologies such as first and second and the like are only used herein to distinguish an entity or operation from another entity or operation, and it is not necessarily required or implied that there are any actual relationship or order of this kind between those entities and operations. Moreover, the verbs mentioned in the application of "comprise", "include"', and any other variants thereof are intended to cover elements or steps in addition to the elements or steps described in the application. The article "a" or "an" before each element cover the existence of multiple elements. In addition, the structure of the above TFT may be an amorphous silicon (a-Si) structure, a Low-Temperature Poly-Si (LTPS) structure or an oxide semiconductor (such as IGZO) structure.

The concept and principle of the present disclosure are described by referring to several embodiments. However, it should be understood that, the present disclosure is not limited to the disclosed embodiments. The division on each aspect does not indicate that the features in these aspects cannot be combined to benefit, and the division is only for convenience of the description. The present disclosure intends to cover various changes and equivalent arrangements included in the spirit and scope of the attached claims. The scope of the attached claims conforms to an explanation in a widest range to contain all of the changes and equivalent structures and functions.

What is claimed is:

1. A display device, comprising:
    a Thin Film Transistor (TFT) substrate and a color filter substrate arranged opposite to each other, wherein the TFT substrate comprises a first TFT element and a second TFT element, and a light-transmission region between the first TFT element and the second TFT element is a pixel region; and
    a pixel unit arranged on a surface of the TFT substrate facing the color filter substrate and located on a surface of the pixel region, wherein the pixel unit comprises a transparent reference potential layer arranged on the surface of the TFT substrate facing the color filter substrate and a nontransparent deformation layer arranged over the transparent reference potential layer and being insulated from the transparent reference potential layer,
    wherein an output electrode of the first TFT element is electrically connected to the transparent reference potential layer, an output electrode of the second TFT element is electrically connected to the nontransparent deformation layer, the nontransparent deformation layer is capable of being deformed flexibly to a deformation state corresponding to a voltage difference between the nontransparent deformation layer and the transparent reference potential layer with a fixed connection part between the nontransparent deformation layer and the TFT substrate acting as a fixed axis based on the voltage difference, to change a coverage area of the nontransparent deformation layer over the pixel region.

2. The display device according to claim 1, further comprising:
    a protection layer on the fixed connection part.

3. The display device according to claim 1, further comprising a support component arranged between the TFT substrate and the color filter substrate, the support component having a thickness greater than a distance between a highest point of the nontransparent deformation layer and an upper surface of the TFT substrate in the event that the nontransparent deformation layer is in a maximally deformed state.

4. The display device according to claim 3, wherein the support component has a cylinder shape, a cube shape, a sphere shape, a corpus vertebrae shape, or a frustum shape.

5. The display device according to claim 1, further comprising:
a conducting layer arranged on a surface of the color filter substrate facing away from the TFT substrate for electrostatic protection.

6. The display device according to claim 1, wherein the pixel unit is located in a hermetically sealed space filled with an oxidation inhibiting gas, and the hermetically sealed space has a pressure not higher than standard atmospheric pressure.

7. The display device according to claim 6, wherein the oxidation inhibiting gas is a nitrogen gas, an inert gas, a mixture of two or more inert gases, or a mixture of the nitrogen gas and one or more inert gases.

8. The display device according to claim 1, wherein the nontransparent deformation layer is titanium, copper, silver or aluminum.

9. The display device according to claim 2, wherein the nontransparent deformation layer is titanium, copper, silver or aluminum.

10. The display device according to claim 3, wherein the nontransparent deformation layer is titanium, copper, silver or aluminum.

11. The display device according to claim 4, wherein the nontransparent deformation layer is titanium, copper, silver or aluminum.

12. The display device according to claim 5, wherein the nontransparent deformation layer is titanium, copper, silver or aluminum.

13. The display device according to claim 1, wherein the nontransparent deformation layer has a thickness in a range from 1 nm to 10000 nm, inclusive.

14. The display device according to claim 2, wherein the nontransparent deformation layer has a thickness in a range from 1 nm to 10000 nm, inclusive.

15. The display device according to claim 3, wherein the nontransparent deformation layer has a thickness in a range from 1 nm to 10000 nm, inclusive.

16. The display device according to claim 4, wherein the nontransparent deformation layer has a thickness in a range from 1 nm to 10000 nm, inclusive.

17. The display device according to claim 5, wherein the nontransparent deformation layer has a thickness in a range from 1 nm to 10000 nm, inclusive.

18. A method for manufacturing a display device, the method comprising:
providing a Thin Film Transistor (TFT) substrate, the TFT substrate comprising a first TFT element and a second TFT element and an insulating layer on the first and second TFT elements;
forming, on the insulation layer, a first groove extending to an output electrode of the first TFT element and a second groove extending to an output electrode of the second TFT element;
forming a reference potential layer on a portion of the insulating layer, the reference potential layer being electrically connected to the output electrode of the first TFT element through the first groove;
forming a deformation layer on the reference potential layer, the deformation layer being insulated from the reference potential layer and electrically connected to the output electrode of the second TFT element through the second groove; and
adhering a color filter substrate on the TFT substrate, the deformation layer and the reference potential layer being located between the color filter substrate and the TFT substrate,
wherein the deformation layer comprises a flexible end capable of being deformed to different deformation states and an opposite fixed end acting as a fixed axis to change a coverage area of the deformation layer over a pixel region between the first TFT element and the second TFT element.

19. The method for manufacturing the display device according to claim 18, further comprising forming a transparent conducting layer on a surface of the color filter substrate facing away from the TFT substrate, before adhering the color filter substrate to the TFT substrate.

20. The method for manufacturing the display device according to claim 18, further comprising:
hermetically sealing a space between the TFT substrate and the color filter substrate; and
filling the space with an oxidation inhibiting gas.

* * * * *